(12) United States Patent
Lu et al.

(10) Patent No.: US 7,674,165 B2
(45) Date of Patent: Mar. 9, 2010

(54) ELECTRONIC DEVICE AND HEAT DISSIPATION MODULE THEREOF

(75) Inventors: Sheng-Chang Lu, Penghu County (TW); Hung-Jen Wei, Nantou (TW); Tzu-Huan Hsu, Taipei County (TW)

(73) Assignee: Qisda Corporation, Taoyuan County (TW)

( * ) Notice: Subject to any disclaimer, the term of this patent is extended or adjusted under 35 U.S.C. 154(b) by 360 days.

(21) Appl. No.: 11/500,590

(22) Filed: Aug. 7, 2006

(65) Prior Publication Data

US 2007/0190926 A1  Aug. 16, 2007

(30) Foreign Application Priority Data

Feb. 10, 2006  (TW) .............................. 95104584 A

(51) Int. Cl.
  H05K 7/20 (2006.01)
  G03B 21/16 (2006.01)
  H05K 5/00 (2006.01)
  F24F 13/08 (2006.01)

(52) U.S. Cl. .................. 454/184; 454/316; 361/679.48; 361/679.49; 361/679.51; 361/695; 353/61

(58) Field of Classification Search ................ 454/184, 454/316; 361/679.48, 679.49, 679.51, 695; 353/61

See application file for complete search history.

(56) References Cited

U.S. PATENT DOCUMENTS

| | | | | |
|---|---|---|---|---|
| 3,674,203 A | * | 7/1972 | McGrath | 236/38 |
| 3,781,127 A | * | 12/1973 | Wood | 415/147 |
| 3,924,605 A | * | 12/1975 | Weinman et al. | 126/307 A |
| 4,086,781 A | * | 5/1978 | Brody et al. | 62/180 |
| 4,370,605 A | * | 1/1983 | Breznican | 318/773 |
| 4,828,168 A | * | 5/1989 | Odajima | 236/49.3 |
| 5,385,031 A | * | 1/1995 | Kizawa et al. | 62/186 |
| 6,142,108 A | * | 11/2000 | Blichmann | 123/41.05 |
| 6,276,895 B1 | * | 8/2001 | Milana | 415/25 |
| 6,641,267 B2 | * | 11/2003 | Ohishi et al. | 353/61 |
| 2004/0212784 A1 | * | 10/2004 | Hsu | 353/61 |
| 2004/0252453 A1 | * | 12/2004 | Brooks et al. | 361/687 |
| 2006/0202045 A1 | * | 9/2006 | Liu | 236/49.3 |

FOREIGN PATENT DOCUMENTS

| | | | |
|---|---|---|---|
| EP | 1561616 A1 | | 8/2005 |
| JP | 02-068996 | | 3/1990 |
| JP | 03129240 A | * | 6/1991 |
| JP | 05332588 A | * | 12/1993 |
| JP | 2001-153427 A | | 6/2001 |
| JP | 2003015223 A | * | 1/2003 |
| JP | 2005-142310 A | | 6/2005 |
| TW | I224237 | | 11/2004 |
| TW | I238287 B | | 8/2005 |
| TW | M286570 | | 1/2006 |

\* cited by examiner

*Primary Examiner*—Steven B McAllister
*Assistant Examiner*—Patrick F. O'Reilly, III

(57) ABSTRACT

An electronic device. The electronic device comprises a heat source, a housing having an inlet and an outlet, a fan disposed in the housing and selectively rotating at a first speed and a second speed higher than the first speed to generate air flow in the housing to cool the heat source, and a plurality of louvers disposed on the housing, having adjustable angles and selectively positioned at a first angle and a second angle. When the louvers are positioned at the first angle, the fan rotates at the first speed, and when the louvers are at the second angle, the fan rotates at the second speed.

20 Claims, 4 Drawing Sheets

ELECTRONIC DEVICE AND HEAT DISSIPATION MODULE THEREOF

BACKGROUND OF THE INVENTION

1. Field of the Invention

The invention relates to an electronic device, and in particular to an electronic device with various heat dissipation modes.

2. Description of the Related Art

Referring to FIG. 1, a conventional projector 100 has an air flow path 10 wherein a fan 20 is disposed to generate air flow along the air flow path 10 to cool light bulb 30 or other electronic elements. Louvers 60 and gratings 70 are often disposed in an inlet 40 or an outlet 50 of the air flow path 10 for shielding or covering. The louvers 60 or the gratings 70, with a fixed open angle, however, cannot be adjusted. Number 80 represents a light machine, and number 90 represents a lens.

BRIEF SUMMARY OF THE INVENTION

An embodiment of an electronic device of the invention comprises a heat source, a housing having an inlet and an outlet, a fan disposed in the housing and selectively rotating at a first speed and a second speed which is faster than the first speed to generate air flow in the housing to cool the heat source, and a plurality of louvers disposed on the housing, having adjustable angles selectively positioned at a first angle and a second angle. When the louvers are positioned at the first angle, the fan rotates at the first speed, and when the louvers are at the second angle, the fan rotates at the second speed.

The louvers can be adjacent to the inlet or the outlet.

The angle of the louvers is adjusted manually. When the angle of the louvers is changed, the speed of the fan is changed.

When the louvers are positioned at the first angle, a first flow resistance is generated in the housing. When the louvers are positioned at the second angle, a second flow resistance is generated in the housing. The first flow resistance is greater than the second flow resistance.

When the fan is stopped, the louvers generate a maximal flow resistance in the housing.

The embodiment further comprises a control unit electrically connected to the fan and the louvers. When the louvers are at the first angle, the control unit drives the fan at the first speed. When the louvers are at the second angle, the control unit drives the fan at the second speed.

The angle of the louvers is adjusted manually. When the angle of the louvers is changed, the control unit changes the fan speed.

When the fan is stopped, the control unit drives the louvers to generate a maximal flow resistance in the housing.

When the louvers are positioned at the first angle, a first flow resistance is generated in the housing. When the louvers are positioned at the second angle, a second flow resistance is generated in the housing, and the first flow resistance is greater than the second resistance.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1:
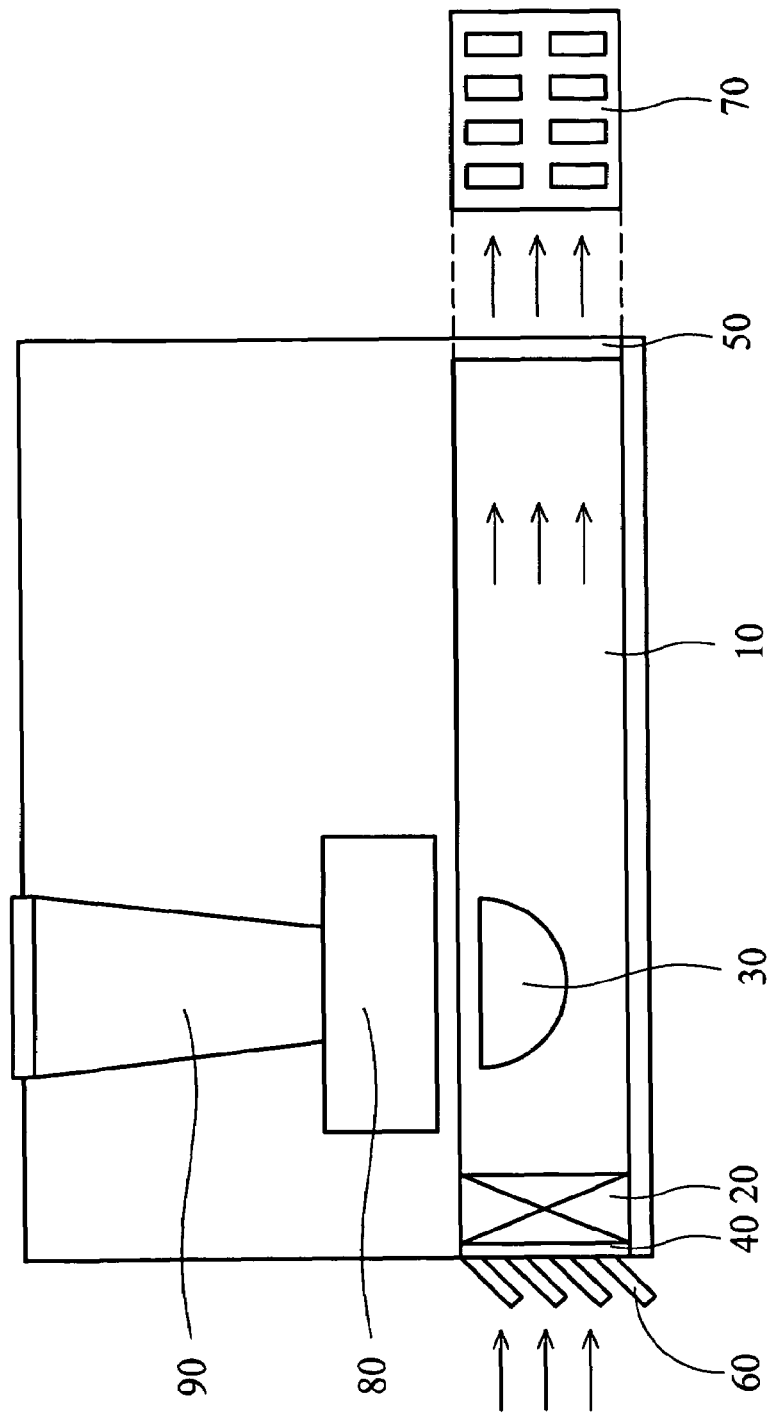
FIG. 1 is a schematic view of a conventional electronic device.
Figure 2:
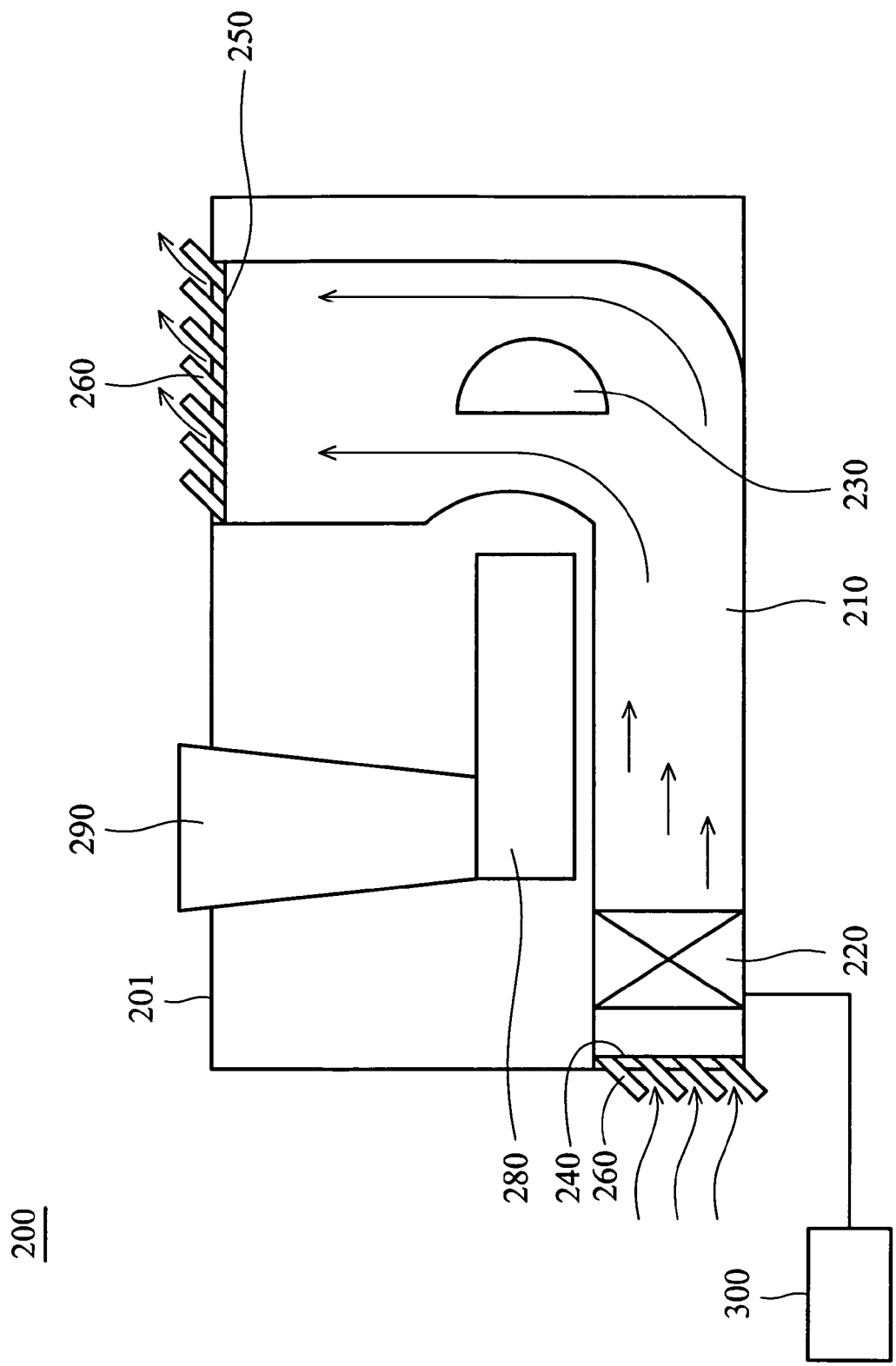
FIG. 2 is a schematic view of an embodiment of an electronic device of the invention.
Figure 3:
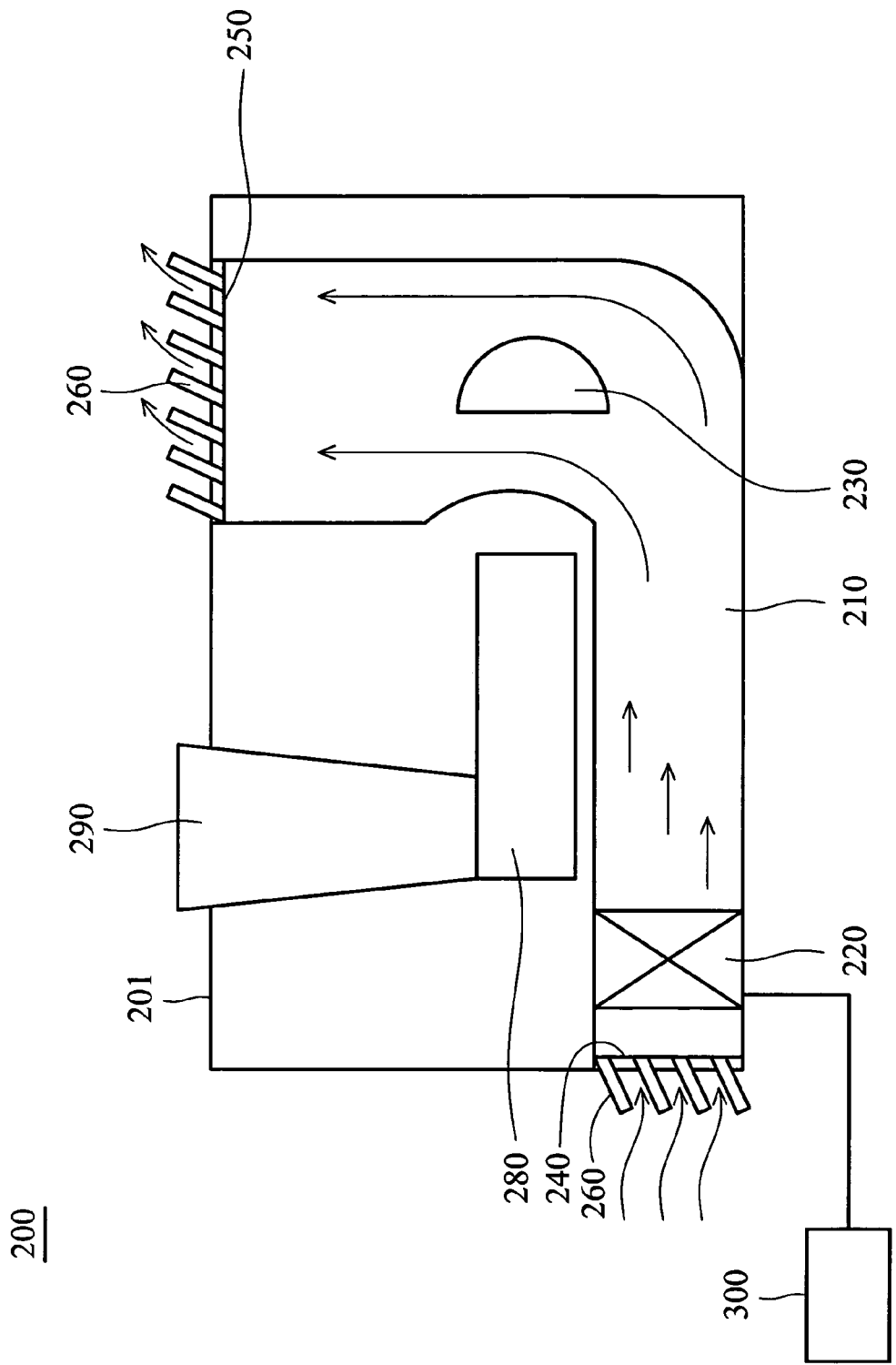
FIG. 3 is a schematic view of an embodiment of an electronic device of the invention.

Referring to FIGS. 2 and 3, an electronic device 200 comprises a housing 201, an air flow path 210, a fan 220, a light bulb (heat source) 230, a light machine 280 and a lens 290. Light from the light bulb 230 passes through the light machine 280 and is projected onto a screen (not shown) via the lens 290. The air flow path 210 has an inlet 240 and an outlet 250. The fan 220 is disposed in the air flow path 210 to generate air flow therein to cool the light bulb 230. A plurality of louvers 260 are disposed in the inlet 240 and the outlet 250 to guide the air flow and prevent light leakage. The angle of the louvers 260 with respect to the housing 201 is adjustable. FIG. 2 shows a small angle (first angle) of the louver 260, which generates a large flow resistance (first flow resistance) in the housing 201. At this time, a control unit 300 drives the fan 220 at a first rotational speed, and the electronic device 200 is in a first heat dissipation mode. FIG. 3 shows a large angle (second angle) of the louver 260, which generates a small flow resistance (second flow resistance) in the housing 201. The control unit 300 drives the fan 220 at a second rotational speed, and the electronic device 200 is in a second heat dissipation mode.

Figure 4D:
FIGS. 4a to 4d show the louvers of the invention at various angles.
Figure 4C:
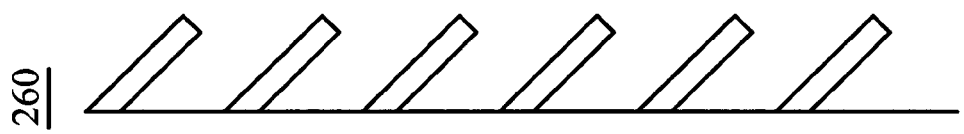
Figure 4B:
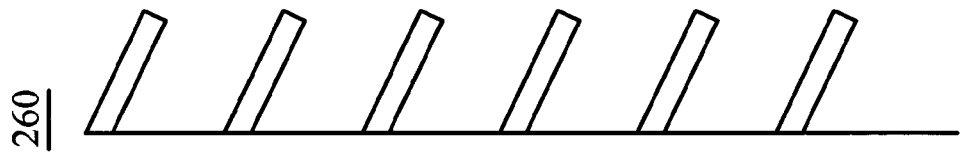
Figure 4A:
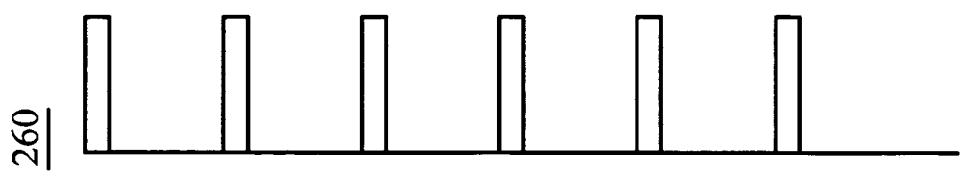

The louver 260 provides for heat dissipation, air flow guidance and light shielding. The air flow enters or leaves the air flow path 210 via the louvers 260. Light from the light bulb 230 is shielded by the louvers 260 to avoid leakage. When the light shielding is emphasized, the angle of the louvers 260 is small. At this time, if the heat dissipation rate is to be maintained (air flow rate is constant), air velocity must be increased, and rotational speed of the fan 220 is higher, resulting in noise in the air flow path 210. On the contrary, if the rotational speed of the fan 220 is reduced, the angle of the louvers 260 must be increased to maintain heat dissipation rate, which results in light leakage. Because the first angle is less than the second angle, the first rotational speed is higher than the second rotational speed. As angle of the louvers 260 increases, the rotational speed of the fan 220 decreases. FIGS. 4a to 4d show various angles of the louvers 260. FIG. 4a shows the louvers 260 fully opened (90°). Flow resistance is at minimum. FIG. 4d shows louvers 260 completely closed (0°). The flow resistance is at maximum. No foreign matter can enter the air flow path 210. The louvers 260 can be at several angles, and the fan 220 changes the rotational speed with the louvers 260. For example, when the louver 260 has a maximal angle, the fan 220 has a minimal rotational speed. At this time, the electronic device 200 has low noise, but light leakage easily occurs. When the louvers 260 are opened to the angle shown in FIG. 4b, the rotational speed of the fan 220 is increased and noise is also increased. When the louvers 260 are opened to the angle shown in FIG. 4c, the fan 220 has an increased rotational speed over FIG. 4b. The noise is larger, but light leakage is reduced. When the electronic device 200 is turned off, louvers 260 close completely to prevent dust or foreign matter from entering the electronic device 200. Hence, the electronic device has several heat dissipation modes which can be categorized by noise level, such as normal mode, quiet mode and silent mode corresponding to large, moderate and small angle of the louvers 260.

In the embodiment, each louver 260 can be opened to the same angle. It is possible to design various angles for each louver 260. For example, the upper louvers 260 may have a large angle, but the lower louvers 260 a small angle.

Louvers 260 can be opened or closed either manually or automatically. Louvers 260 can also be opened corresponding to the rotational speed of the fan 220.

Although louvers 260 in this embodiment are disposed in the inlet 240 and the outlet 250, they can be disposed only in the inlet 240 or the outlet 250.

While the invention has been described by way of example and in terms of a preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A projector, comprising:
   a light module;
   a housing having an inlet and an outlet;
   a fan disposed in the housing and selectively rotating at a first speed and a second speed to generate air flow in the housing to cool the light module; and
   a plurality of louvers disposed on the housing to prevent light leakage, having manually adjustable angles and selectively positioned at a first angle and a second angle, wherein the air flow flows out of the housing through the louvers of the outlet when the fan operates, and when the louvers are positioned at the first angle, the fan rotates at the first speed, and when the louvers are at the second angle, the fan rotates at the second speed, and when the first angle is smaller than the second angle, the first speed is higher than the second speed; and
   wherein the first and second angle are measured between a cross-sectional plane of the outlet and a side of each of the plurality of louvers.

2. The projector as claimed in claim 1, wherein the louvers are adjacent to the inlet.

3. The projector as claimed in claim 1, wherein the louvers are adjacent to the outlet.

4. The projector as claimed in claim 1, wherein the angle of the louvers is adjusted manually, and when the angle of the louvers is changed, the speed of the fan is changed.

5. The projector as claimed in claim 1, wherein when the louvers are positioned at the first angle, a first flow resistance is generated in the housing, and when the louvers are at the second angle, a second flow resistance is generated in the housing, less than the first flow resistance.

6. The projector as claimed in claim 1, wherein when the fan is stopped, the louvers generates a maximal flow resistance in the housing.

7. The projector as claimed in claim 1 further comprising a control unit electrically connected to the fan and the louvers, wherein when the louvers are at the first angle, the control unit drives the fan to rotate at the first speed, and when the louvers are at the second angle, the control unit drives the fan to rotate at the second speed.

8. The projector as claimed in claim 7, wherein the angle of the louvers is adjusted manually, and when the angle of the louvers is changed, the control unit changes the fan speed.

9. The projector as claimed in claim 7, wherein when the fan is stopped, the control unit drives the louvers to generate a maximal flow resistance in the housing.

10. The projector as claimed in claim 7, wherein when the louvers are at the first angle, a first flow resistance is generated in the housing, and when the louvers are at the second angle, a second flow resistance is generated in the housing, less than the first flow resistance.

11. The projector as claimed in claim 1, wherein the fan is disposed near the inlet.

12. A projector, comprising:
    a light module;
    a housing having an inlet and an outlet;
    a fan disposed in the housing and selectively rotating at a first speed and a second speed to generate air flow in the housing to cool the light module; and
    a plurality of louvers disposed on the housing, having manually adjustable angles and selectively positioned at a first angle and a second angle, wherein when the louvers are positioned at the first angle, the fan rotates at the first speed, and when the louvers are at the second angle, the fan rotates at the second speed, and when the first angle is smaller than the second angle, the first speed is higher than the second speed, and the air flow flows out of the housing through the louvers of the outlet when the fan operates; and
    wherein the first and second angle are measured between a cross-sectional plane of the outlet and a side of each of the plurality of louvers.

13. The projector as claimed in claim 12, wherein the louvers are adjacent to the inlet or the outlet.

14. The projector as claimed in claim 12, wherein the angle of the louvers is adjusted manually, and when the angle of the louvers is changed, the speed of the fan is changed.

15. The projector as claimed in claim 12, wherein when the louvers are positioned at the first angle, a first flow resistance is generated in the housing, and when the louvers are at the second angle, a second flow resistance is generated in the housing, less than the first flow resistance.

16. The projector as claimed in claim 12, wherein the fan is disposed near the inlet.

17. The projector as claimed in claim 12 further comprising a control unit electrically connected to the fan and the louvers, wherein when the louvers are at the first angle, the control unit drives the fan to rotate at the first speed, and when the louvers are at the second angle, the control unit drives the fan to rotate at the second speed.

18. The projector as claimed in claim 17, wherein the angle of the louvers is adjusted manually, and when the angle of the louvers is changed, the control unit changes the fan speed.

19. The projector as claimed in claim 17, wherein when the fan is stopped, the control unit drives the louvers to generate a maximal flow resistance in the housing.

20. The projector as claimed in claim 17, wherein when the louvers are at the first angle, a first flow resistance is generated in the housing, and when the louvers are at the second angle, a second flow resistance is generated in the housing, less than the first flow resistance.

* * * * *